US009967117B2

(12) United States Patent
Shin et al.

(10) Patent No.: US 9,967,117 B2
(45) Date of Patent: May 8, 2018

(54) COOPERATIVE SPECTRUM SENSING SYSTEM USING SUB-NYQUIST SAMPLING AND METHOD THEREOF (71) Applicant: SOONGSIL UNIVERSITY RESEARCH CONSORTIUM TECHNO-PARK, Seoul (KR)

(72) Inventors: Yoan Shin, Seoul (KR); Honggyu Jung, Seoul (KR); Kwang-Yul Kim, Seoul (KR)

(73) Assignee: SOONGSIL UNIVERSITY RESEARCH CONSORTIUM TECHNO-PARK, Seoul (KR)

(*) Notice: Subject to any disclaimer, the term of this patent is extended or adjusted under 35 U.S.C. 154(b) by 47 days.

(21) Appl. No.: 15/224,679

(22) Filed: Aug. 1, 2016

(65) Prior Publication Data
US 2017/0041170 A1 Feb. 9, 2017

(30) Foreign Application Priority Data

Aug. 7, 2015 (KR) .......... 10-2015-0111585
Oct. 12, 2015 (KR) .......... 10-2015-0142064

(51) Int. Cl.
G01R 31/08 (2006.01)
H04L 5/14 (2006.01)
H04L 12/28 (2006.01)
H04J 3/16 (2006.01)
H04L 27/00 (2006.01)
H03M 7/30 (2006.01)

(52) U.S. Cl.
CPC ...... H04L 27/0006 (2013.01); H03M 7/3062 (2013.01)

(58) Field of Classification Search
CPC .......................... H04L 27/0006; H04L 27/32
See application file for complete search history.

(56) References Cited

U.S. PATENT DOCUMENTS 8,077,758 B2  12/2011  Goldberg
8,836,557 B2   9/2014  Eldar et al.
(Continued)

FOREIGN PATENT DOCUMENTS

KR  10-1152572 B1  6/2012
KR  10-1189904 B1  10/2012
KR  10-1535251 B1  7/2015

Primary Examiner — Faruk Hamza
Assistant Examiner — Abu-Sayeed Haque
(74) Attorney, Agent, or Firm — Revolution IP, PLLC (57) ABSTRACT Disclosed is a cooperative spectrum sensing system using sub-Nyquist sampling, which include: a plurality of secondary user terminals for detecting a frequency band occupied by a primary user terminal; and a fusion center, wherein each of the secondary user terminals may include: a receiving unit for receiving signals from the primary user terminal; a sampling unit for performing the sub-Nyquist sampling for the received signals at a predetermined down-sampling rate; an energy-detecting unit for detecting the frequency band occupied by the primary user terminal by detecting energy for the sampled signals; and a calculating unit for calculating a correct detection probability and a false alarm probability for the frequency band occupied by the primary user terminal by using spectrum of the frequency band, and for transmitting results of calculation to the fusion center.

14 Claims, 7 Drawing Sheets

(56) References Cited

U.S. PATENT DOCUMENTS

| | | | |
|---|---|---|---|
| 9,651,649 B1* | 5/2017 | Salloum | G01S 3/802 |
| 2003/0036853 A1* | 2/2003 | Sammak | G01N 15/1475 |
| | | | 702/19 |
| 2010/0117647 A1* | 5/2010 | Madore | G01R 33/561 |
| | | | 324/310 |
| 2011/0022342 A1* | 1/2011 | Pandharipande | H04B 17/309 |
| | | | 702/75 |
| 2013/0332085 A1* | 12/2013 | Yang | G01R 35/00 |
| | | | 702/22 |
| 2014/0162528 A1* | 6/2014 | Derby, Jr. | A63H 19/24 |
| | | | 446/410 |
| 2015/0103958 A1* | 4/2015 | Yilmaz | H04W 16/14 |
| | | | 375/341 |
| 2016/0007871 A1* | 1/2016 | Sanger | A61B 5/7264 |
| | | | 600/546 |
| 2016/0131734 A1* | 5/2016 | Ray | G01S 5/02 |
| | | | 342/450 |

* cited by examiner

COOPERATIVE SPECTRUM SENSING SYSTEM USING SUB-NYQUIST SAMPLING AND METHOD THEREOF

CROSS-REFERENCE TO RELATED APPLICATION

This application claims priority to and the benefit of Korean Patent Application No. 10-2015-0111585, filed on Aug. 7, 2015, and Korean Patent Application No. 10-2015-0142064, filed on Oct. 12, 2015 in the Korean Intellectual Property Office, the entire contents of which are incorporated herein by reference in their entirety.

BACKGROUND OF THE INVENTION (a) Field of the Invention

The present disclosure relates to a cooperative spectrum sensing system using sub-Nyquist sampling and a method thereof. More particularly, the present disclosure relates to a cooperative spectrum sensing system, which allows a secondary (unlicensed) user renting frequency bands from a primary (licensed) user to detect an available frequency band, which is not occupied by the primary user, by using sub-Nyquist sampling, and a method thereof.

(b) Description of the Related Art

Federal Communications Commission (FCC) announced a research result that many parts of frequency bands are not used at the same time and they are very inefficiently used on time and space. To resolve a shortage of the frequency bands and to promote efficient utilization of the frequency bands, in recent, studies on cognitive radio networks (CRNs) have been actively conducted.

The cognitive radio networks are intelligent radio networks that allow a secondary (unlicensed) user renting frequency bands from a primary (licensed) user to timely access an available frequency band without causing disruptive interference with the primary user. To construct the cognitive radio networks, the secondary user needs to rapidly perform accurate broadband spectrum sensing for an unoccupied frequency band.

In the broadband spectrum sensing, sampling of very high speed should be performed to satisfy the Nyquist sampling rate, so an analog to digital converter (ADC) capable of performing the high speed sampling is necessarily required. However, since considerable cost is entailed to implement such an ADC, in practice it is nearly impossible to implement the broadband spectrum sensing as a hardware.

In detail, the broadband spectrum sensing may be basically divided into three fields: implement of the ADC for the Nyquist sampling, implement of a compressive sensing system, and implement of a sensing system using sub-Nyquist sampling.

However, the spectrum sensing system using the Nyquist sampling has a drawback that very expensive equipments such as a high-speed ADC should be prepared to construct such a system. In recent, accordingly, studies on construction of the compressive sensing system and the sensing system using the sub-Nyquist sampling have been more actively conducted.

In this case, the compressed sensing has very high complexity in a process of reconstruct signals compressed at a sampling rate lower than the Nyquist sampling rate to original signals, but the sub-Nyquist sampling has very low complexity in implementing an algorithm.

However, in the cognitive radio networks, there is a drawback that to obtain a closed form for sensing performance is impossible due to irregular occupancy of spectrum by the primary user and aliasing effect of the Nyquist sampling.

Korean Patent Publication No. 1189904 (published on Oct. 10, 2012) discloses a background technique of the present disclosure.

SUMMARY OF THE INVENTION

The present invention has been made in an effort to provide a cooperative spectrum sensing system using sub-Nyquist sampling, which allows a secondary (unlicensed) user renting frequency bands from a primary (licensed) user in cognitive radio networks to detect a frequency band which is not occupied by the primary user without causing disruptive interference with the primary user, and method thereof.

The present invention has been made in another effort to provide a cooperative spectrum sensing system using sub-Nyquist sampling, which is capable of performing spectrum sensing with a smaller number of samples and comparatively low complexity in implementing an algorithm because performance of detection by the sub-Niquist sampling is analyzed with formulas under the condition that the sparsity of the frequency band desired to be use is known.

To accomplish the objects of the present disclosure, an exemplary embodiment of the present disclosure provides a cooperative spectrum sensing system using sub-Nyquist sampling, which may include: a plurality of secondary user terminals for detecting a frequency band occupied by a primary user terminal; and a fusion center. Each of the secondary user terminals may include: a receiving unit for receiving signals from the primary user terminal; a sampling unit for performing the sub-Nyquist sampling for the received signals at a predetermined down-sampling rate; an energy-detecting unit for detecting the frequency band occupied by the primary user terminal by detecting energy for the sampled signals; and a calculating unit for calculating a correct detection probability and a false alarm probability for the frequency band occupied by the primary user terminal by using spectrum of the frequency band, and for transmitting results of calculation to the fusion center.

The energy-detecting unit may determine that the corresponding frequency band is occupied by the primary user terminal when the detected energy is equal to or larger than a threshold value, and may determine that the corresponding frequency band is not occupied by the primary user terminal when the detected energy is smaller than the threshold value.

The calculating unit may calculate the correct detection probability for the frequency band occupied by the primary user terminal by using the following equation:

$$P_{D,i,m}(\tau) = 1 - F_{\chi^2}\left(\frac{2N_0}{\gamma+L}\tau; 2N_0\right),$$

where i denotes an index of the secondary user terminal, m denotes a channel, $\tau$ denotes the threshold value, $N_0$ denotes the size of index set included in a frequency axis at the corresponding channel, $\gamma$ denotes the signal to noise ratio (SNR) in spectrum bin, and L denotes a down-sampling rate.

The calculating unit may calculate the false alarm probability for the frequency band occupied by the primary user terminal by using the following equation:

$$P_{F,i,m}(\tau) = 1 - F_{\chi^2}\left(\frac{2N_0}{L}\tau; 2N_0\right)$$

The fusion center may receive results of calculation from the plurality of secondary user terminals which perform the sampling at the same down-sampling rate, and if the down-sampling rate is smaller than a reference value, may calculate the correct detection probability and the false alarm probability for the frequency band occupied by the primary user terminal by using AND-rule as in the following equations:

$$Q_{AND,D,m} = \prod_{i=1}^{J} P_{D,i,m}$$

$$Q_{AND,F,m} = \prod_{i=1}^{J} P_{F,i,m},$$

where $Q_{AND,D,m}$ denotes the correct detection probability and $Q_{AND,F,m}$ denotes the false alarm probability.

If the down-sampling rate is equal to or larger than the reference value, the fusion center may calculate the correct detection probability and the false alarm probability for the frequency band occupied by the primary user terminal by using OR-rule as in the following equations:

$$Q_{OR,D,m} = 1 - \prod_{i=1}^{J}(1 - P_{D,i,m})$$

$$Q_{OR,F,m} = 1 - \prod_{i=1}^{J}(1 - P_{F,i,m}),$$

where $Q_{OR,D,m}$ denotes the correct detection probability and $Q_{OR,F,m}$ denotes the false alarm probability.

Another exemplary embodiment of the present disclosure provides a cooperative spectrum sensing method using sub-Nyquist sampling, in which a plurality of secondary user terminals for detecting a frequency band occupied by a primary user terminal, and a fusion center are used. The method may include: a step in which each of the secondary user terminals receives signals from the primary user terminal; a step in which each of the secondary user terminals performs the sub-Nyquist sampling for the received signals at a predetermined down-sampling rate; a step in which each of the secondary user terminals detects the frequency band occupied by the primary user terminal by detecting energy for the sampled signals; and a step in which each of the secondary user terminals calculates a correct detection probability and a false alarm probability for the frequency band occupied by the primary user terminal by using spectrum of the frequency band; and a step in which each of the secondary user terminals transmits results of calculation to the fusion center.

In cognitive radio networks, the cooperative spectrum sensing system using the sub-Nyquist sampling and method thereof according to the embodiment of the present disclosure allow the secondary user renting the frequency bands from the primary (licensed) user to detect an available frequency band which is not occupied by the primary user by using a low-speed ADC. Accordingly, reduction of cost for constructing the spectrum sensing system, which should be first considered in the cognitive radio networks, may become possible.

In addition, the present disclosure utilizes the sub-Nyquist sampling under the condition that the sparsity of the frequency band desired to be use is known, thereby exhibiting an excellent effect with respect to the complexity as well as obtaining prominent spectrum-sensing performance even with a small number of samples.

DETAILED DESCRIPTION OF THE INVENTION

Hereinafter, exemplary embodiments of the present invention will be described in detail with reference to the accompanying drawings. The terminology used herein is defined in consideration of the function of corresponding components used in the present disclosure and may be varied according to users, operator's intention, or practices. In addition, an arbitrary defined terminology may be used in a specific case and will be described in detail in a corresponding description paragraph. Therefore, the terminology used herein is for the purpose of describing particular embodiments only and is not intended to be limiting of the invention.

First, a cooperative spectrum sensing system using sub-Nyquist sampling according to an exemplary embodiment of the present disclosure is described with reference to FIG. 1 and FIG. 2.

Figure 1:
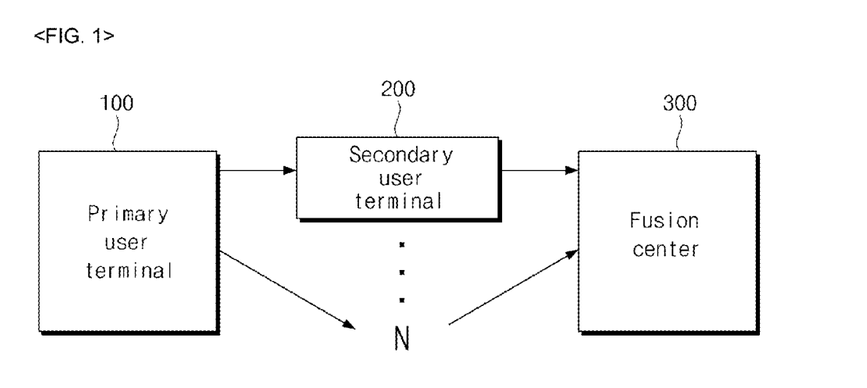
FIG. 1 is a schematic block diagram of a cooperative spectrum sensing system using sub-Nyquist sampling according to an exemplary embodiment of the present disclosure.
Figure 2:
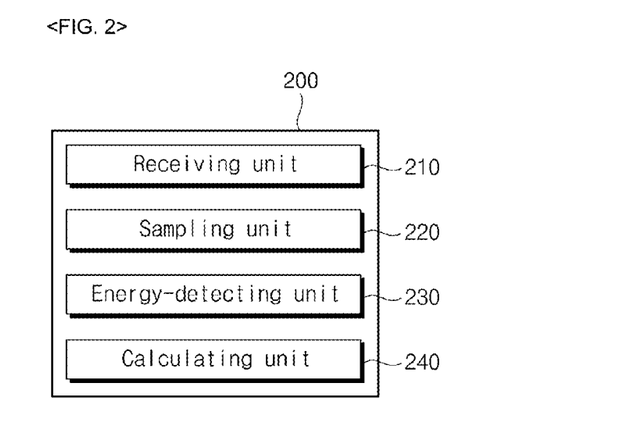
FIG. 2 is a schematic block diagram of a secondary user terminal according to the exemplary embodiment of the present disclosure.

FIG. 1 is a schematic block diagram of the cooperative spectrum sensing system using sub-Nyquist sampling according to the exemplary embodiment of the present disclosure, and FIG. 2 is a schematic block diagram of a secondary user terminal according to the exemplary embodiment of the present disclosure.

Referring to FIG. 1, the cooperative spectrum sensing system using sub-Nyquist sampling according to the exemplary embodiment of the present disclosure includes a primary user terminal 100, a secondary user terminal 200, and a fusion center 300.

The primary user terminal 100 is a user primarily using a specific frequency band, or a licensed user for the corresponding frequency band. For example, KBS (Korean Broadcasting System), SKT (SK telecom), etc. correspond to the primary user terminal 100.

The secondary user terminal 200 is a user using a rented frequency band. In detail, the secondary user terminal 200 detects the frequency band occupied by the primary user terminal 100, and then accesses an unoccupied portion of the detected frequency band without causing disruptive interference to the primary user terminal 100.

As shown in FIG. 1, the number of the secondary user terminal 200 for detecting the frequency band occupied by the primary user terminal 100 may be plural. The secondary user terminal 200 includes a receiving unit 210, a sampling unit 220, an energy-detecting unit 230, and a calculating unit 240, as shown in FIG. 2.

The receiving unit 210 receives signals from the primary user terminal 100.

The sampling unit 220 performs sub-Nyquist sampling of the signals received through the receiving unit 210 at a predetermined down-sampling rate.

In Nyquist sampling, the entire signals for a frequency band are received and then high-speed sampling for the received signals is performed by a high-speed sampling ADC (analog to digital converter), but in the sub-Nyquist sampling, signals fewer than the received signals in the Nyquist sampling are received at a predetermined down-sampling rate and then low speed sampling for the received signals is performed.

Accordingly, the sampling unit 220 samples only the signals randomly received in the entire frequency bands at the predetermined down-sampling rate.

The energy-detecting unit 230 detects the frequency band occupied by the primary user terminal 100 by detecting the energy for the sampled signals.

In this case, the energy-detecting unit 230 determines that the corresponding frequency band is occupied by the primary user terminal 100 when the detected energy is equal to or larger than a threshold value. In addition, the energy-detecting unit 230 determines that the corresponding frequency band is not occupied by the primary user terminal 100 when the detected energy is smaller than the threshold value.

The calculating unit 240 calculates a correct detection probability and a false alarm probability for the frequency band occupied by the primary user terminal 100 by using a uniform degree of the spectrum for the frequency band, and transmits results of the calculation to the fusion center 300.

The fusion center 300 receives the calculation results from a plurality of secondary user terminals 200, each of which performs the sampling at the same down-sampling rate, and then calculates the correct detection probability and the false alarm probability for the frequency band, which is occupied by the primary user terminal 100, depending on the down-sampling rate by using AND-rule and OR-rule.

Hereinafter, a sensing method using the cooperative spectrum sensing system according to the exemplary embodiment of the present disclosure is described in detail.

Figure 3:
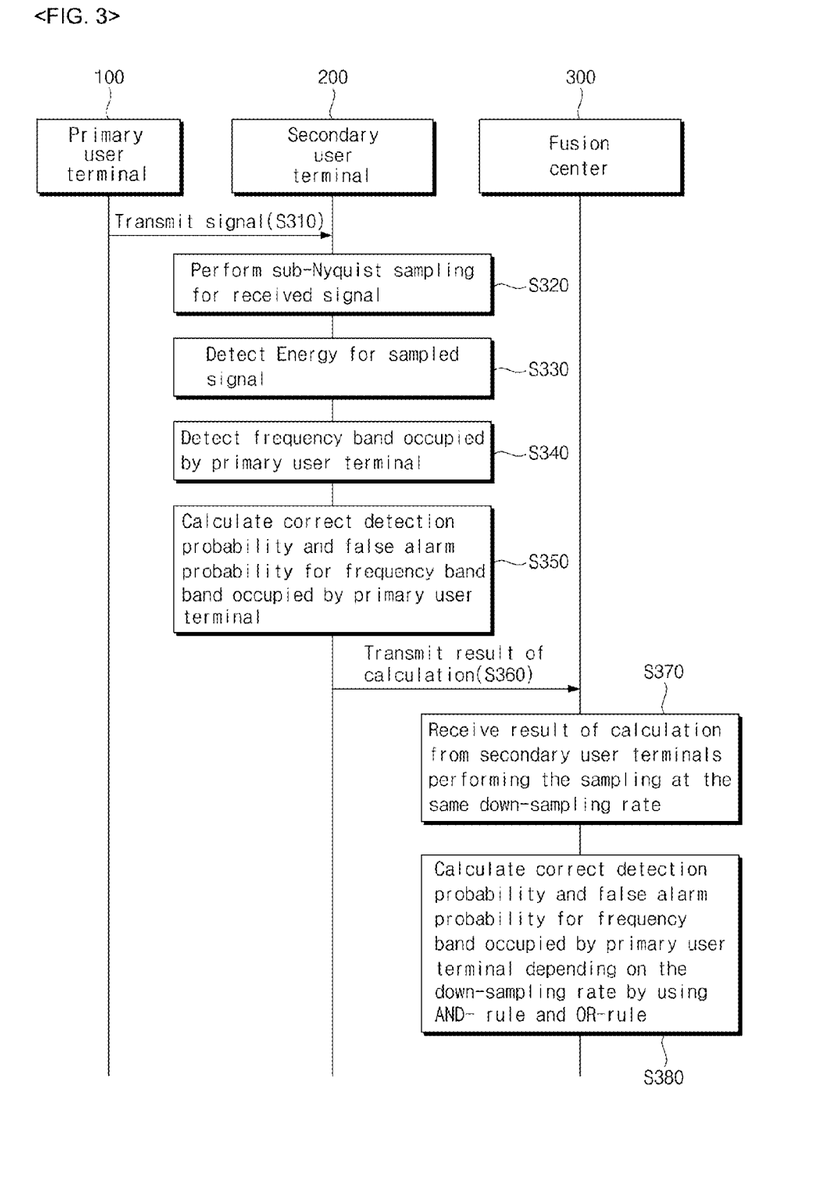
FIG. 3 is a flow chart illustrating a cooperative spectrum sensing method using sub-Nyquist sampling according to the exemplary embodiment of the present disclosure.

FIG. 3 is a flow chart illustrating the cooperative spectrum sensing using the sub-Nyquist sampling according to the exemplary embodiment of the present disclosure, and a detailed operation of the present disclosure is described with reference to this figure.

In the cooperative spectrum sensing using the sub-Nyquist sampling according to the exemplary embodiment of the present disclosure, the primary user terminal 100 first transmits signals to the plurality of secondary user terminals 200 at step S310.

Then, at step S320, each of the secondary user terminals 200 performs the sub-Nyquist sampling for the received signals at a predetermined down-sampling rate.

In Nyquist sampling, the entire signals for a frequency band are received and then high-speed sampling for the received signals is performed by a high-speed sampling ADC (analog to digital converter), but in the sub-Nyquist sampling, signals fewer than the received signals in the Nyquist sampling are received at a predetermined down-sampling rate and then low speed sampling for the received signals is performed.

Accordingly, at the step S320, the sampling is performed only for the signals randomly received in the entire frequency bands at the predetermined down-sampling rate.

In detail, in cognitive radio networks, the signal which the secondary user terminal 200 (whose index is i) receives is represented by the following Equation 1, and is sampled by the sub-Nyquist sampling at the down-sampling rate L, as shown in Equation 2 and Equation 3.

Here, Equation 3 is obtained by applying Fourier transform to Equation 2.

$$x_i(t)=s(t)+n_i(t) \qquad \text{<Equation 1>}$$

where $x_i(t)$ is the signal which the secondary user terminal 200 (whose index is i) receives, s(t) is the signal which the primary user terminal 100 transmits, and $n_i(t)$ denotes a noise which is applied to the secondary user terminal 200 (whose index is i).

$$y_i(t) = x_i(t)\sum_{m \in Z} \delta(t-mLT), \qquad \text{< Equation 2 >}$$

where $y_i(t)$ is the signal sampled at the predetermined down-sampling rate, m denotes a channel, L denotes an interval of sampling, and T denotes a sampling time.

$$y_i[n] = \begin{cases} x_i[n] = x_i(nT), & n = mL \\ 0, & \text{otherwise} \end{cases}, \qquad \text{< Equation 3 >}$$

where $y_i[n]$ denotes a function defined by two parameters having integer values, and n is the signal at the predetermined down-sampling rate.

To analyze a frequency axis, discrete impulse train v[n] and discrete Fourier transform V[k] of the function are calculated by the following Equation 4 and Equation 5.

$$v[n] = \sum_{m=0}^{N-1} \delta[n-mL], \; 0 \le n < NL, \qquad \text{< Equation 4 >}$$

where N denotes the number of signals created by the sampling.

$$V[k] = \sum_{n=0}^{NL-1}\left\{\sum_{m=0}^{N-1}\delta[n-mL]\right\}e^{\frac{-2\pi ikm}{NL}} \quad \text{<Equation 5>}$$

$$= \sum_{m=0}^{N-1} e^{\frac{-2\pi ikm}{N}}$$

$$= N\sum_{i=0}^{L-1}\delta[k-iN], \; 0 \leq k < NL$$

With respect to the frequency axis, Equation 2 may be expressed as Equation 6, and a relation between the sub-Nyquist sampling and Nyquist sampling can be seen through Equation 7.

$$Y_i[k] = X_i[k] * \frac{1}{N}V[k], \quad \text{<Equation 6>}$$

where Y[k] and X[k] denote discrete Fourier transform (DFT) of Y[n] and X[n], respectively, ★ denotes circular convolution, and $$\frac{1}{N}$$

denotes a scale factor for simply representing the probability of detection which will be analyzed later.

$$Y_i[k] = \sum_{i=0}^{L-1} X_i[(k-iN)_{NL}], \; 0 \leq k < N, \quad \text{<Equation 7>}$$

where $(\bullet)_{NL}$ denotes a modulo operator.

Next, at step S330, the secondary user terminal 200 detects energy for the signals sampled at the step S320, and at step S340 detects the frequency band occupied by the primary user terminal 100.

In this case, the secondary user terminal 200 determines that the corresponding frequency band is occupied by the primary user terminal 100 when the energy detected at the step S340 is equal to or larger than the threshold value and that the corresponding frequency band is not occupied by the primary user terminal 100 when the detected energy is smaller than the threshold value.

As a result, aliasing effect of the sub-Nyquist sampling can be estimated by Equation 7, and it can be seen that to restore the signals to nyqust sampling signals is impossible because L signals are added.

Accordingly, to detect the signals of the primary user terminal 100 based on the Equation 7, the presence and absence of the signal are determined by detecting energy for the sampled signals by using the following Equation 8.

$$T_{i,m} = \frac{1}{N_0}\sum_{k \in I_m} |Y_i[k]|^2 \underset{H_0}{\overset{H_1}{\gtreqless}} \tau, \quad \text{<Equation 8>}$$

where the threshold value is a reference value determining the presence and absence of the signal, $I_m$ denotes an index set included in the frequency axis at the corresponding channel, and $N_0$ denotes the size of $I_m$.

That is, it is determined that the signal is inputted, which is represented as $H_1$ in Equation 8, when the detected energy is equal to or larger than the threshold value. In addition, it is determined that the signal is not inputted, which is represented as $H_0$ in Equation 8, when the detected energy is smaller than the threshold value.

Here, $Y_i[k]$ is modeled by multi-variate Gaussian distribution whose average value is 0. On the assumption that distributions of $\sigma_{s,m,k}^2$ of S[k] in $I_m$ have the same values and distribution $\sigma_N^2$ of the noise is normalized, probability distribution of $T_m$ may be expressed by Equation 9:

$$T_{i,m} \sim \frac{\sum_{i \in A_m}\sigma_{i,m,d}^2 + L\sigma_N^2}{2N_0}\chi_{2N_s}^2, \quad \text{<Equation 9>}$$

where $A_m$ denotes an index set including spectral support of L signals added at the channel, and $x_{2,N_0}^2$ denotes Chi-square distribution whose degree of freedom is $2N_0$.

Then, at step S350, the secondary user terminal 200 calculates the correct detection probability and false alarm probability for the frequency band occupied by the primary user terminal 100 by using the sparsity of the spectrum for the frequency band, and at step S360 transmits results of the calculation to the fusion center 300.

According to the analysis described above, a probability density function (PDF) of $T_m$ at $H_1$ and $H_0$ may be represented by the following Equation 10 and Equation 11.

$$f_{T_{i,m}|H_1} = \sum_{\alpha=0}^{L-1}\binom{L-1}{\alpha}\frac{2N_0}{\sum_{j \in A_m^{\alpha+1}}\gamma_j + L} \cdot \quad \text{<Equation 10>}$$

$$f_{\chi^2}\left(\frac{2N_0}{\sum_{j \in A_m^{\alpha+1}}\gamma_j + L}t_{i,m}; 2N_0\right)$$

$$f_{T_{i,m}|H_0} = \quad \text{<Equation 11>}$$

$$\sum_{\alpha=0}^{L-1}\binom{L-1}{\alpha}\frac{2N_0}{\sum_{j \in A_m^{\alpha}}\gamma_j + L} \cdot f_{\chi^2}\left(\frac{2N_0}{\sum_{j \in A_m^{\alpha}}\gamma_j + L}t_{i,m}; 2N_0\right)$$

In Equation 10 and Equation 11, $\gamma_j$ is the signal to noise ratio (SNR) in the j-th spectrum bin, and $A_m^\alpha$ denotes $A_m$ satisfying $|A_m|=\alpha$. Accordingly, the correct detection probability and false alarm probability for the frequency band occupied by the primary user terminal 100 are respectively calculated by the following Equation 12 and Equation 13.

$$P_{D,i,m} = 1 - \int_0^\tau f_{T_{i,m}|H_1}\,dt_{i,m} \quad \text{<Equation 12>}$$

$$= 1 - \sum_{\alpha=0}^{L-1}\binom{L-1}{\alpha}F_{\chi^2}\left(\frac{2N_0}{\sum_{j \in A_m^{\alpha+1}}\gamma_j + L}t_{i,m}; 2N_0\right)$$

$$P_{F,i,m} = 1 - \int_0^\tau f_{T_{i,m}|H_0}\,dt_{i,m} \quad \text{<Equation 13>}$$

$$= \sum_{\alpha=0}^{L-1}\binom{L-1}{\alpha}\left(1 - F_{\chi^2}\left(\frac{2N_0}{\sum_{j \in A_m^{\alpha}}\gamma_j + L}\tau; 2N_0\right)\right)$$

As can be seen from Equation 12 and Equation 13, in the case of the sub-nyquist sampling, accurate formulars for detection probabilities can't be obtained due to uncertainty of the spectrum support $A_m$. However, in the present disclosure, it is assumped that accurate detection probabilities can be obtained by using the following lemma.

On the assumption that the probability that a specific frequency index is included in the spectrum support $A_m$ is defined by P=s/NL in the frequency band whose sparsity s is known, if NL>s is satisfied, the probability that two or more signals existing in the spectrum support $A_m$ are added by the sub-nyquist sampling converges on 0.

That is, since the maximum value of $|A_m|$ is 1, Equation 12 and Equation 13 are summarized as Equation 14 and Equation 15.

$$P_{D,i,m}(\tau) = 1 - F_{\chi^2}\left(\frac{2N_0}{\gamma+L}\tau; 2N_0\right) \qquad <\text{Equation 14}>$$

$$P_{F,i,m}(\tau) = 1 - F_{\chi^2}\left(\frac{2N_0}{L}\tau; 2N_0\right) \qquad <\text{Equation 15}>$$

In Equation 14 and Equation 15, i denotes an index of the secondary user terminal 200, m denotes a channel, $\tau$ denotes the threshold value, $N_0$ denotes the size of index set included in the frequency axis at the corresponding channel, $\gamma$ denotes the signal to noise ratio (SNR) in the spectrum bin, and L denotes the down-sampling rate.

Next, at step S370, the fusion center 300 receives results of calculation from the plurality of secondary user terminals 200, each of which performs the sampling at the same down-sampling rate.

Next, at step S380, the fusion center 300 respectively calculates the correct detection probability and the false alarm probability for the frequency band occupied by the primary user terminal 100 depending on the down-sampling rate by using AND-rule and OR-rule.

In further detail, considering hard decision for the cooperative spectrum sensing, the fusion center 300 calculates the correct detection probability by the AND-rule, as given by the following Equation 16, and calculates the false alarm probability by the AND-rule, as given by the following Equation 17.

$$Q_{AND,D,m} = \prod_{i=1}^{J} P_{D,i,m} \qquad <\text{Equation 16}>$$

$$Q_{AND,F,m} = \prod_{i=1}^{J} P_{F,i,m} \qquad <\text{Equation 17}>$$

In addition, the fusion center 300 calculates the correct detection probability by the OR-rule, as given by the following Equation 18, and calculates the false alarm probability by the OR-rule, as given by the following Equation 19.

$$Q_{OR,D,m} = 1 - \prod_{i=1}^{J}(1 - P_{D,i,m}) \qquad <\text{Equation 18}>$$

$$Q_{OR,F,m} = 1 - \prod_{i=1}^{J}(1 - P_{F,i,m}) \qquad <\text{Equation 19}>$$

That is, in the present disclosure, the number N of created signals * the down-sampling rate L may be set through the sampling so that the entire procedures can satisfy the lemma.

FIG. 4 to FIG. 8 show results of simulations for verifying performance of the present disclosure.

Before a description of the simulation results, in this embodiment, it is assumed that the total available spectrum of N=0.1 MHz consists of 1,000 channels, each of which has the same bandwidth of 100 Hz, and that two secondary user terminals 200 randomly occupy different channels to each other.

Figure 4:
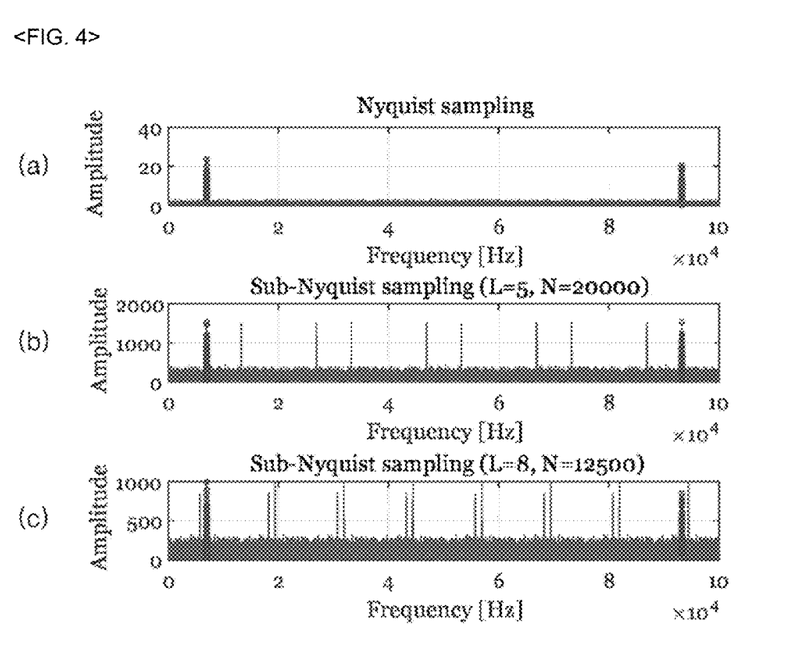
FIG. 4 shows graphs for comparing results after the Nyquist sampling and sub-Nyquist sampling are each performed.

In FIG. 4, (a) shows signals created by the sub-Nyquist sampling when the signal to noise ratio (SNR) is xdB, and (b) and (c) show results of the sub-Nyquist sampling performed when the down-sampling rate L is 5 and 8, respectively. Referring to this figure, it can be seen that performance is improved as the sub-Nyquist sampling rate approaches the Nyquist sampling rate due to an influence of the noise.

Figure 5:
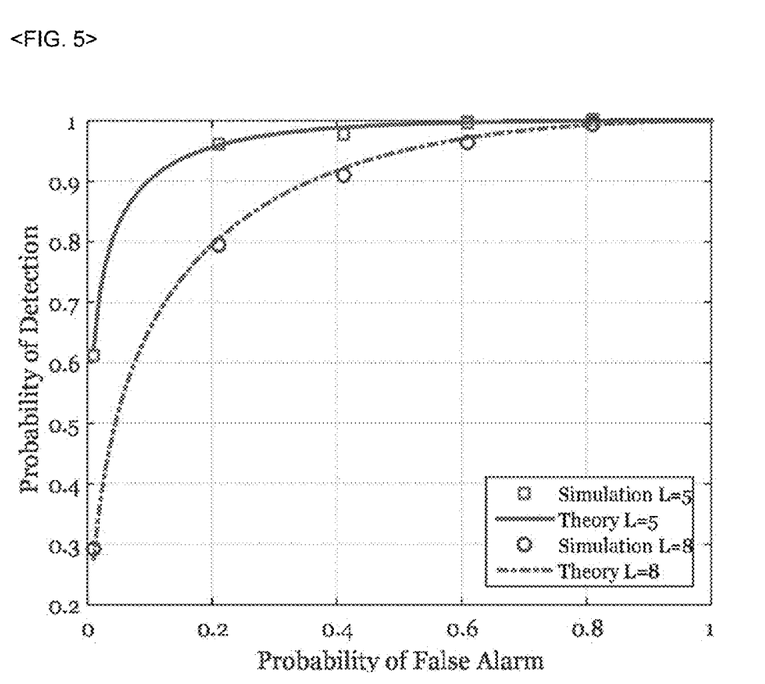
FIG. 5 is a graph for comparing receiver operating characteristic (ROC) curves of the sampling performed at different down-sampling rates and the same signal to noise rate.
Figure 6:
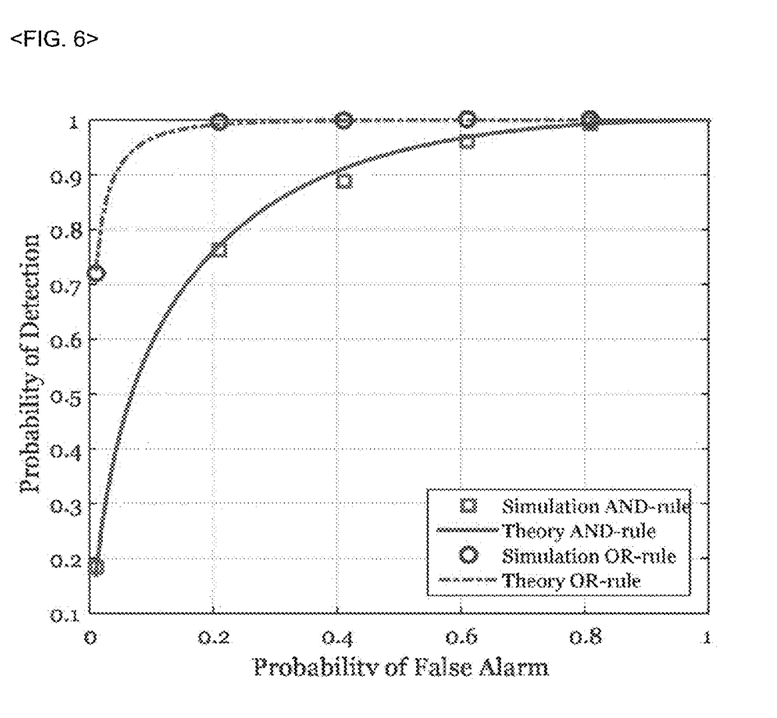
FIG. 6 is a graph for comparing receiver operating characteristic (ROC) curves of AND-rule and OR-rule at the same signal to noise rate.

FIG. 5 is a graph for comparing receiver operating characteristic (ROC) curves of the sampling performed at different down-sampling rates and the same signal to noise rate, and FIG. 6 is a graph for comparing ROC curves of AND-rule and OR-rule at the same signal to noise rate.

In detail, FIG. 5 shows ROC curves after two secondary user terminals 200 perform the spectrum sensing when the signal to noise ratio is dB, and FIG. 6 shows ROC curves after the fusion center 300 performs hard decision. Referring to FIG. 6, it can be seen that performance of the OR-rule is more excellent than that of the AND-rule. In addition, it can be seen that the lemma 1 is satisfied with high probability under the conditions (that is, NL=100,000 and S=200) of this simulation.

Figure 7:
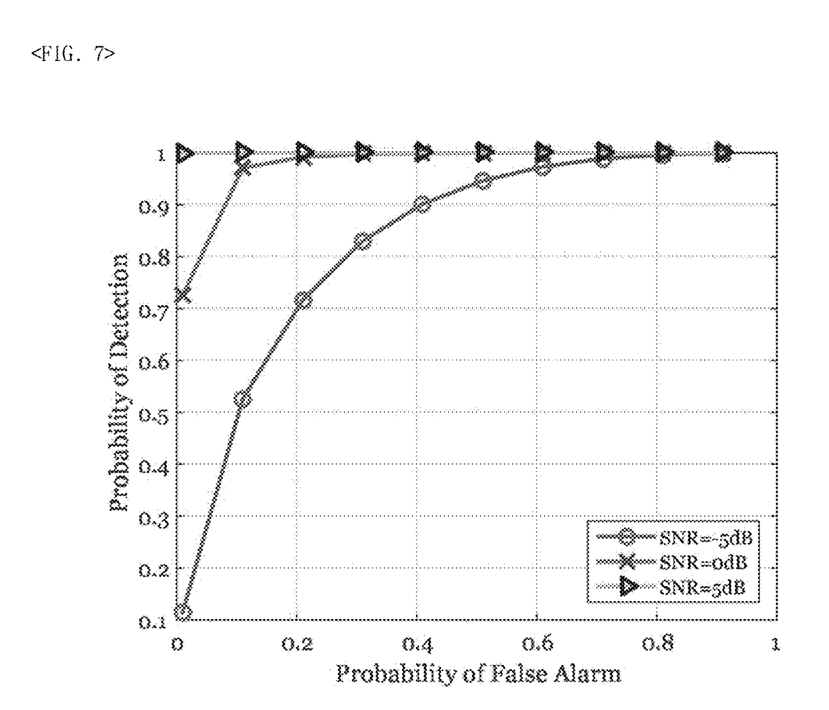
FIG. 7 is a graph for illustrating receiver operating characteristic (ROC) curves of the OR-rule at various signal to noise ratios.
Figure 8:
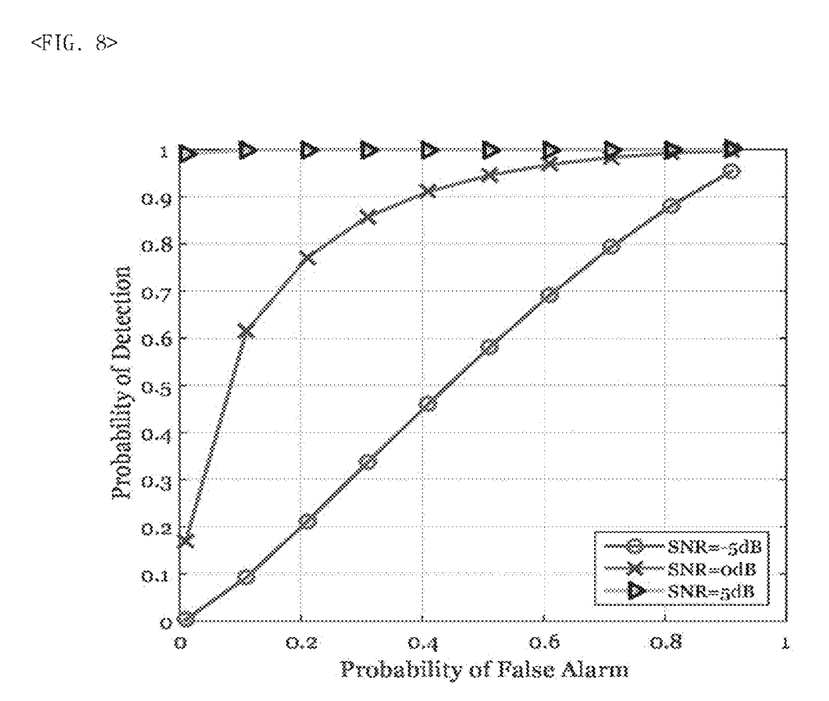
FIG. 8 is a graph for illustrating receiver operating characteristic (ROC) curves of the AND-rule at various signal to noise ratios.

FIG. 7 shows a graph for illustrating ROC curves of the OR-rule at various signal to noise ratios, and FIG. 8 shows a graph for illustrating ROC curves of the AND-rule at various signal to noise ratios.

FIG. 7 and FIG. 8 show cooperative spectrum sensing performances of the OR-rule and AND-rule, which are varied as the signal to noise ratio is varied. In these figures, it can be seen that all of two techniques show perfect detection performance when the signal to noise ratio is 5 dB or more.

As described above, in cognitive radio networks, the cooperative spectrum sensing system using the sub-Nyquist sampling and method thereof according to the embodiment of the present disclosure allow a secondary (unlicensed) user renting frequency bands from a primary (licensed) user to detect an available frequency band, which is not occupied by the primary user, by using a low-speed ADC. Accordingly, reduction of cost for constructing the spectrum sensing system, one of the problems which should be first considered in the cognitive radio networks, may become possible.

In addition, the present disclosure utilizes the sub-Nyquist sampling under the condition that the sparsity of the frequency band desired to be use is known, thereby exhibiting an excellent effect with respect to the complexity as well as obtaining prominent spectrum-sensing performance even with a small number of samples.

Example embodiments have been disclosed herein and although specific terms are employed, they are used and are to be interpreted in a generic and descriptive sense only and not for purpose of limitation. In some examples, as would be apparent to one of ordinary skill in the art as of the filing of the present application, features, characteristics, and/or elements described in connection with a particular embodiment may be used singly or in combination with features, characteristics and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cooperative spectrum sensing system using sub-Nyquist sampling, comprising:
a plurality of secondary user terminals for detecting a frequency band occupied by a primary user terminal; and
a fusion center,
wherein each of the secondary user terminals includes one or more units being configured and executed by a processor using algorithm, the algorithm which when executed, causing the processor to perform the one or more units, the one or more units comprising,
a receiving unit including a receiver for receiving signals from the primary user terminal;
in response to detection of the signals, a sampling unit including a sampler for performing the sub-Nyquist sampling for the received signals at a predetermined down-sampling rate;
an energy-detecting unit including a detector for detecting the frequency band occupied by the primary user terminal by detecting energy for the sampled signals; and
a calculating unit including the processor for calculating a correct detection probability and a false alarm probability for the frequency band occupied by the primary user terminal by using spectrum of the frequency band, and in response to detection of the calculated correct detection probability and the false alarm probability, transmitting results of the calculated correct detection probability and the false alarm probability to the fusion center.

2. The system of claim 1, wherein the energy-detecting unit determines that the corresponding frequency band is occupied by the primary user terminal when the detected energy is equal to or larger than a threshold value, and determines that the corresponding frequency band is not occupied by the primary user terminal when the detected energy is smaller than the threshold value.

3. The system of claim 1, wherein the calculating unit calculates the correct detection probability for the frequency band occupied by the primary user terminal by using the following equation:

$$P_{D,i,m}(\tau) = 1 - F_{\chi^2}\left(\frac{2N_0}{\gamma+L}\tau; 2N_0\right),$$

where i denotes an index of the secondary user terminal, m denotes a channel, $\tau$ denotes the threshold value, $N_0$ denotes the size of index set included in a frequency axis at the corresponding channel, $\gamma$ denotes the signal to noise ratio (SNR) in spectrum bin, and L denotes a down-sampling rate.

4. The system of claim 3, wherein the calculating unit calculates the false alarm probability for the frequency band occupied by the primary user terminal by using the following equation:

$$P_{F,i,m}(\tau) = 1 - F_{\chi^2}\left(\frac{2N_0}{L}\tau; 2N_0\right).$$

5. The system of claim 4, wherein the fusion center receives results of calculation from the plurality of secondary user terminals, each of which performs the sampling at the same down-sampling rate, and if the down-sampling rate is smaller than a reference value, calculates the correct detection probability and the false alarm probability for the frequency band occupied by the primary user terminal by using AND-rule as in the following equations:

$$Q_{AND,D,m} = \prod_{i=1}^{J} P_{D,i,m}$$

$$Q_{AND,F,m} = \prod_{i=1}^{J} P_{F,i,m},$$

where $Q_{AND,D,m}$ denotes the correct detection probability and $Q_{AND,F,m}$ denotes the false alarm probability.

6. The system of claim 3, wherein the fusion center receives results of calculation from the plurality of secondary user terminals, each of which performs the sampling at the same down-sampling rate, and if the down-sampling rate is smaller than a reference value, calculates the correct detection probability and the false alarm probability for the frequency band occupied by the primary user terminal by using AND-rule as in the following equations:

$$Q_{AND,D,m} = \prod_{i=1}^{J} P_{D,i,m}$$

$$Q_{AND,F,m} = \prod_{i=1}^{J} P_{F,i,m},$$

where $Q_{AND,D,m}$ denotes the correct detection probability and $Q_{AND,F,m}$ denotes the false alarm probability.

7. The system of claim 6, if the down-sampling rate is equal to or larger than a reference value, wherein the fusion center calculates the correct detection probability and the false alarm probability for the frequency band occupied by the primary user terminal by using OR-rule as in the following equations:

$$Q_{OR,D,m} = 1 - \prod_{i=1}^{J} (1 - P_{D,i,m})$$

$$Q_{OR,F,m} = 1 - \prod_{i=1}^{J} (1 - P_{F,i,m}),$$

where $Q_{OR,D,m}$ denotes the correct detection probability and $Q_{OR,F,m}$ denotes the false alarm probability.

8. A cooperative spectrum sensing method using sub-Nyquist sampling, in which a plurality of secondary user terminals for detecting a frequency band occupied by a primary user terminal, and a fusion center are used, the method comprising:
a step in which each of the secondary user terminals receives signals from the primary user terminal;

a step in which each of the secondary user terminals performs the sub-Nyquist sampling for the received signals at a predetermined down-sampling rate;

a step in which each of the secondary user terminals detects the frequency band occupied by the primary user terminal by detecting energy for the sampled signals; and a step in which each of the secondary user terminals calculates a correct detection probability and a false alarm probability for the frequency band occupied by the primary user terminal by using spectrum of the frequency band; and a step in which each of the secondary user terminals transmits results of calculation to the fusion center.

9. The method of claim 6, wherein the step of detecting the frequency band includes a step of determining that the corresponding frequency band is occupied by the primary user terminal when the detected energy is equal to or larger than a threshold value, and a step of determining that the corresponding frequency band is not occupied by the primary user terminal when the detected energy is smaller than the threshold value.

10. The method of claim 8, wherein the correct detection probability for the frequency band occupied by the primary user terminal is calculated by the following equation:

$$P_{D,i,m}(\tau) = 1 - F_{\chi^2}\left(\frac{2N_0}{\gamma+L}\tau; 2N_0\right),$$

where i denotes an index of the secondary user terminal 200, m denotes a channel, $\tau$ denotes the threshold value, $N_0$ denotes the size of index set included in a frequency axis at the corresponding channel, $\gamma$ denotes the signal to noise ratio (SNR) in spectrum bin, and L denotes a down-sampling rate.

11. The method of claim 10, wherein the false alarm probability for the frequency band occupied by the primary user terminal is calculated by the following equation:

$$P_{F,i,m}(\tau) = 1 - F_{\chi^2}\left(\frac{2N_0}{L}\tau; 2N_0\right).$$

12. The method of claim 11, further comprising:
a step in which the fusion center receives results of calculation from the plurality of secondary user terminals, each of which performs the sampling at the same down-sampling rate; and
a step in which the fusion center calculates the correct detection probability and the false alarm probability for the frequency band occupied by the primary user terminal, if the down-sampling rate is smaller than a reference value, by using AND-rule as in the following equations:

$$Q_{AND,D,m} = \prod_{i=1}^{J} P_{D,i,m}$$

$$Q_{AND,F,m} = \prod_{i=1}^{J} P_{F,i,m},$$

where $Q_{AND,D,m}$ denotes the correct detection probability and $Q_{AND,F,m}$ denotes the false alarm probability.

13. The method of claim 10, further comprising:
a step in which the fusion center receives results of calculation from the plurality of secondary user terminals, each of which performs the sampling at the same down-sampling rate; and
a step in which the fusion center calculates the correct detection probability and the false alarm probability for the frequency band occupied by the primary user terminal, if the down-sampling rate is smaller than a reference value, by using AND-rule as in the following equations:

$$Q_{AND,D,m} = \prod_{i=1}^{J} P_{D,i,m}$$

$$Q_{AND,F,m} = \prod_{i=1}^{J} P_{F,i,m},$$

where $Q_{AND,D,m}$ denotes the correct detection probability and $Q_{AND,F,m}$ denotes the false alarm probability.

14. The method of claim 13, if the down-sampling rate is equal to or larger than the reference value, wherein the fusion center calculates the correct detection probability and the false alarm probability for the frequency band occupied by the primary user terminal by using OR-rule as in the following equations:

$$Q_{OR,D,m} = 1 - \prod_{i=1}^{J}(1 - P_{D,i,m})$$

$$Q_{OR,F,m} = 1 - \prod_{i=1}^{J}(1 - P_{F,i,m}),$$

where $Q_{OR,D,m}$ denotes the correct detection probability and $Q_{OR,F,m}$ denotes the false alarm probability.

* * * * *